United States Patent
Bhatt et al.

[11] Patent Number: 6,009,620
[45] Date of Patent: Jan. 4, 2000

[54] METHOD OF MAKING A PRINTED CIRCUIT BOARD HAVING FILLED HOLES

[75] Inventors: Ashwinkumar C. Bhatt, Endicott; Joseph A. Kotylo, Binghamton, both of N.Y.; Kenneth S. Lyjak, Warrenton, Va.; Amarjit S. Rai; John A. Welsh, both of Vestal, N.Y.

[73] Assignee: International Business Machines Corporation, Armonk, N.Y.

[21] Appl. No.: 09/115,715

[22] Filed: Jul. 15, 1998

[51] Int. Cl.⁷ .................................................. H05K 3/42
[52] U.S. Cl. .............................................. 29/852; 29/846
[58] Field of Search ............................. 29/830, 840, 846, 29/847, 852; 427/97

[56] References Cited

U.S. PATENT DOCUMENTS

| | | | |
|---|---|---|---|
| 3,613,230 | 10/1971 | Griff | 29/628 R |
| 4,017,968 | 4/1977 | Weglin | 29/853 |
| 4,319,708 | 3/1982 | Lomerson | 228/111 |
| 4,681,649 | 7/1987 | Fazlin | 156/285 |
| 4,704,791 | 11/1987 | Chellis et al. | 29/852 |
| 4,791,248 | 12/1988 | Oldenettel | 174/68.5 |
| 4,792,646 | 12/1988 | Enomoto | 174/68.5 |
| 4,967,314 | 10/1990 | Higgins, III | 361/792 |
| 4,983,252 | 1/1991 | Masui et al. | 430/296 |
| 5,006,182 | 4/1991 | Gantzhorn et al. | 156/89 |
| 5,028,743 | 7/1991 | Kawakami et al. | 174/264 |
| 5,117,069 | 5/1992 | Higgins, III | 174/261 |
| 5,118,458 | 6/1992 | Nishihara et al. | 264/155 |
| 5,146,674 | 9/1992 | Frankeny et al. | 29/830 |
| 5,153,986 | 10/1992 | Brauer et al. | 29/846 |
| 5,224,265 | 7/1993 | Dux et al. | 29/852 |
| 5,243,142 | 9/1993 | Ishikawa et al. | 174/262 |
| 5,271,150 | 12/1993 | Inasaka | 29/852 |
| 5,288,665 | 2/1994 | Nulman | 438/672 |
| 5,346,750 | 9/1994 | Hatakeyama et al. | 428/209 |
| 5,421,083 | 6/1995 | Suppelsa et al. | 29/852 |
| 5,443,672 | 8/1995 | Stoll et al. | 156/244.17 |
| 5,450,290 | 9/1995 | Boyko et al. | 361/792 |
| 5,451,722 | 9/1995 | Gregoire | 174/261 |
| 5,487,218 | 1/1996 | Bhatt et al. | 29/852 |
| 5,557,844 | 9/1996 | Bhatt et al. | 29/852 |
| 5,568,682 | 10/1996 | Gates, Jr. et al. | 29/831 |
| 5,571,593 | 11/1996 | Arldt et al. | 428/131 |
| 5,662,987 | 9/1997 | Mizumoto et al. | 428/209 |
| 5,665,650 | 9/1997 | Lauffer et al. | 216/20 |
| 5,666,722 | 9/1997 | Tamm et al. | 29/847 |
| 5,685,070 | 11/1997 | Alpaugh et al. | 29/840 |
| 5,689,091 | 11/1997 | Hamzehdoost et al. | 174/255 |
| 5,740,606 | 4/1998 | Rose | 29/840 |
| 5,745,984 | 5/1998 | Cole, Jr. et al. | 29/834 |
| 5,779,836 | 7/1998 | Kerrick | 156/150 |
| 5,822,856 | 10/1998 | Bhatt et al. | 29/832 |

OTHER PUBLICATIONS

IBM Technical Disclosure Bulletin, vol. 11, No. 7, Dec. 1968, "Face Protection Of Printed Circuit Boards", by McDermott.

*Primary Examiner*—Lee Young
*Assistant Examiner*—Bobby Rushing, Jr.
*Attorney, Agent, or Firm*—Lawrence R. Fraley

[57] ABSTRACT

A method of making a circuitized substrate wherein fill material is forced into the substrate's holes to thus provide additional support for conductive circuitry or the like thereon, thus increasing the final product's circuit density. The fill is provided in a substantially uncured state, following which partial cure occurs. Thereafter, the fill is substantially fully cured and the aforementioned circuit elements may then be provided directly thereon. Alternatively, a dual fill process is used with both quantities of uncured fill being disposed in each hole and then cured by a singular UV exposure step.

34 Claims, 2 Drawing Sheets

METHOD OF MAKING A PRINTED CIRCUIT BOARD HAVING FILLED HOLES

TECHNICAL FIELD

This invention relates to the manufacture of printed circuit boards and particularly to methods for making such boards wherein at least one and preferably several through holes are provided in the board, e.g., for providing interconnections with internal conductive planes or even to circuitry located on an opposite side of the board. Specifically, this invention defines a new and unique method of substantially filling such holes wherein the filled holes form part of the completed board structure.

CROSS-REFERENCE TO COPENDING APPLICATIONS

In Ser. No. (S.N.) 08/672,292, filed Jun. 28, 1996 and entitled "Manufacturing High Density Computer Systems With Circuit Board Assemblies Having Filled Vias Free From Bleed-Out" (inventors A. Bhatt et al), there is described a circuit board structure and method for making same wherein fill material is positioned (e.g., using injection or heat and pressure) in holes (called "vias") in the board's substrate. A laminate peel-apart structure is used, in addition to one or more photoresist patterns which may be formed. The following patent applications have also been filed from Ser. No. 08/672,292 following a restriction requirement by the United States Patent and Trademark Office:

Ser. No. 09/030,587, filed Feb. 25, 1998;
Ser. No. 09/033,456, filed Mar. 2, 1998;
Ser. No. 09/033,617, filed Mar. 3, 1998;
Ser. No. 09/021,772, filed Mar. 10, 1998;
Ser. No. 09/041,845, filed Mar. 12, 1998.

In Ser. No. 08/857,188, filed May 15, 1997 and entitled: "Method For Filling Holes In Printed Wiring Boards" (inventors: B. Appelt et al), there is described a method of filling printed wiring (circuit) boards with photoimageable material wherein the material is at least partially cured before forcing it into the board's hole(s), after which it is fully cured and further board processing (e.g., circuitization) occurs.

In Ser. No. 09/076,649, filed May 12, 1998 and entitled: "Method Of Making A Printed Circuit Board Having Fill Holes And Fill Member For Use Therewith" (inventors: D. Farquhar et al), there is described a method of filling holes in a circuitized substrate (e.g., printed circuit board) wherein a thin, support layer having fill material thereon is subjected to an appropriate force wherein the support layer ruptures and fill then is forced into the substrate's hole(s). Further board processing then occurs.

BACKGROUND OF THE INVENTION

Many known current printed circuit board constructions require one or more external conductive layers, e.g., circuitry and/or pads for mounting components thereon, and, given today's increased functional demands, a plurality of internal conductive planes, e.g., signal, power and/or ground. To provide effective interconnections between such surface components and the board's conductive circuitry, internal planes and/or pads, the. use of conductive through holes has been adopted wherein several such holes are formed in the board and electrically coupled in a selective manner to internal and external conductive elements. Such holes typically include a conductive, e.g., copper, layer as part thereof which in turn contacts the also typically copper circuitry, pads and/or internal planes.

The term "through hole" or simply "hole" as used herein is meant to include both conductive and non-conductive apertures which may extend entirely through the circuit board or even only partly therethrough (such partial holes are often also called "vias" in the circuit board field), including between only one or more internal layers without being externally exposed. Examples of various circuit board structures which include holes of these types are defined in several published documents, including the following U.S. Letters Patents, issued on the dates identified:

| | | |
|---|---|---|
| 4,704,791 | Chellis et al | 11/10/87 |
| 5,450,290 | Boyko et al | 09/12/95 |
| 5,487,218 | Bhatt et al | 01/30/96 |
| 5,557,844 | Bhatt et al | 09/24/96 |
| 5,571,593 | Arldt et al | 11/05/96 |
| 5,662,987 | Mizumoto et al | 09/02/97 |

All of these patents are assigned to the same assignee as the present invention and are incorporated herein by reference, as are the teachings of the aforementioned copending applications.

Printed circuit boards of the above type are particularly adapted for having one or more (usually several) electrical components, e.g., semiconductor chips, capacitors, resistors, etc., mounted on an external surface thereof and coupled to various, selected internal conductive planes within the board's dielectric substrate. As demands for increased levels of integration in semiconductor chips and other electrical components continue, parallel demands call for concurrent increased functional capabilities, e.g., increased circuit densities, in printed circuit boards adapted for use with such components. Such demands further emphasize the growing need for more closely spaced electrical components on the board's outer surfaces. For those boards possessing greater functional capabilities and therefore which use several through holes therein, it is highly desirable to position the electrical components directly over the holes to maximize board real estate while assuring a compact, miniaturized final board product.

Increased demands such as those above are particularly significant when it is desirable to couple what are referred to as ball grid array (BGA) or similar components directly onto the board's outer conductive layer(s). These components typically include a plurality of highly dense conductors, e.g., solder ball elements, closely positioned in a fixed pattern on the component's undersurface. This is also the case for directly mounted semiconductor chips (also known in this technology as direct chip attach (or DCA) components) wherein a dense pattern of several minute solder balls are arranged on the chip's small undersurface (that directly facing the underlying circuit board). To successfully accommodate such components, filling of the board's holes with conductive material (called "fill") has been tried, with one or more examples defined in the above-identified issued Letters Patents and copending applications. To accomplish such filling, it is often necessary to utilize a mask or the like with pre-formed, e.g., drilled or punched, apertures therein which coincide with the desired hole pattern. Once provided in the necessary precise alignment, various filler materials have been attempted, including both electrically conductive and non-conductive. One example of such a filler is defined in aforementioned U.S. Pat. No. 5,487,218, wherein the composition is an organic polymeric material with an optional particular filler added thereto to modify the thermal and/or electrical properties of the composition. One excellent reason for such modification is to approximately match the coefficients of thermal expansion of both board substrate material and contained filler.

In an alternative process such as defined in Ser. No. 09/076,649, a mask is not necessary and instead a composite member of a thin support layer and fill material is simply positioned over the substrate's holes and then subjected to sufficient force to rupture the support layer and force the fill into the holes. The support layer is then removed and the filled structure subjected to subsequent processing. Attention is again directed to Ser. No. 08/857,188 for a somewhat similar approach but wherein it is considered necessary to partially cure the fill prior to forcing it into the substrate. Such a partially cured member thus forms what can be referred to as a "plug" which is of sufficient rigidity to enable the subsequent force application. In both of these applications, the filled hole can serve as a platform for receiving subsequent metallization thereon (e.g., to form a circuit line or pad) which forms part of the structure's circuitry. Understandably, the circuit's density is increased as a result of such a feature.

It is believed that a new and unique method of making a circuitized substrate having at least one (and possibly several) holes therein which are filled in an expeditious manner provide the advantages cited above (while also obviating the need for mask members and relatively strong force application) would represent a significant advancement in the art.

OBJECTS AND SUMMARY OF THE INVENTION

It is, therefore, a primary object of the present invention to enhance the art of printed circuit board manufacture by providing a new and unique method of making such a board wherein filled holes form part of the finished structure.

It is another object of the invention to provide such a method which can be performed in an expeditious manner adaptable for mass production, thereby maintaining the costs of making such a board end product relatively low.

It is still another object of the invention to provide such a method which can be successfully accomplished without the need for a mask or the like having preformed openings therein which must necessarily align with the already formed board hole pattern during the fill process.

These and other objects are met by the present invention which defines a method for making a circuitized substrate (e.g., a printed circuit board) which comprises the steps of providing a layer of dielectric material, forming at least one hole within the layer of dielectric material, positioning a quantity of uncured fill material in the at least one hole, only partially curing the positioned quantity of fill material in the hole, removing fill material from the substrate's external surface and thereafter fully curing the hole's fill material.

According to another aspect of the invention, there is provided a method of making a circuitized substrate wherein substantially only a singular cure step is implemented, this occurring also while the uncured fill is positioned in the substrate's hole(s). This method comprises the steps of providing a layer of dielectric material having a first surface, forming at least one hole within the layer of dielectric material, removing the uncured, dielectric fill material on at least part of the first surface, positioning a second quantity of uncured, dielectric fill material onto the first surface and substantially over at least one hole having the first quantity of uncured, dielectric fill material therein, and thereafter substantially curing the dielectric fill material within and substantially over the at least one hole.

BEST MODE FOR CARRYING OUT THE INVENTION

For a better understanding of the present invention, together with other and further objects, advantages and capabilities thereof, reference is made to the following disclosure and appended claims in connection with the above-described drawings.

In FIGS. 1–5, there are illustrated various steps for making a circuitized substrate (e.g., a printed circuit board) in accordance with the preferred teachings of the present invention. It is to be understood that a key feature of this invention involves the provision of a circuitized substrate having a plurality of through-holes therein wherein said holes are filled with an appropriate quantity of electrically non-conductive fill material so that additional circuitry or other conductive elements (e.g., pads) may be formed atop such filled holes to thereby increase the availability of the substrate's total real estate, or wherein electrical components (e.g., chip-containing modules) may be positioned directly thereover and coupled thereto, if desired. Concerning the latter, filled holes will prevent needed encapsulant material from passing through the substrate and thus remain in its proper protective location about and/or over the module's housing and coupling contact elements (e.g., solder balls).

Figure 1:
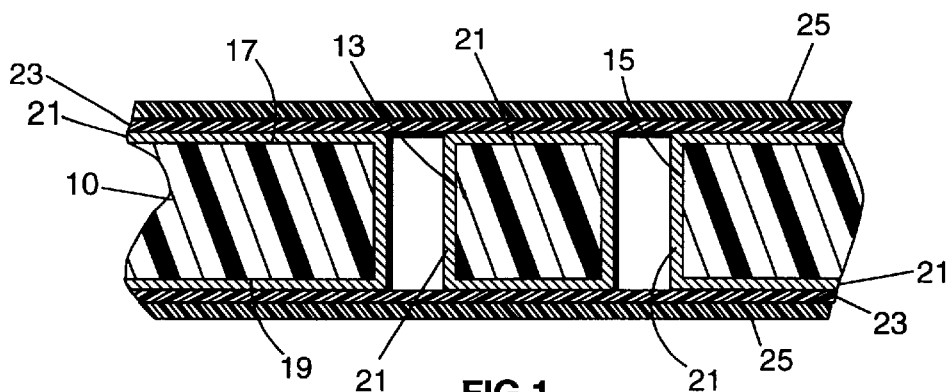
FIGS. 1–5 illustrate the various steps of performing the method taught herein to produce a circuitized substrate, in accordance with a preferred embodiment thereof.

In FIG. 1, there is shown a layer 10 of dielectric material which will form the dielectric portion of the substrate built in accordance with the teachings herein. Layer 10 is preferably of fiberglass-reinforced cured epoxy resin material, also known in the art as "FR4". It is understood that layer 10 may be of other dielectric materials, including, e.g., polytetrafluoroethylene. Layer includes two holes 13 and 15 therein, each of which extend from the layer's upper surface 17 to its undersurface 19. It is understood, however, that this invention is not limited solely to holes which pass entirely through the substrate's dielectric layer. That is, one or more holes within the finished structure produced in accordance with the teachings herein may only occupy a partial depth within the dielectric material. In the broader aspects of the invention, it is understood that layer 10 need only include one hole. In one example, a substantially rectangular dielectric layer having dimensions of about 19 inches by 24 inches and a total of up to about 5000 holes may be provided. The dielectric layer of this example possessed a thickness of about 0.007 to about 0.020 inch. Layer 10 is also shown in FIG. 1 to include a relatively thin conductive layer 21 on the upper and lower surfaces 17 and 19, as well as on the internal walls of holes 13 and 15. Preferably this conductive layer is copper and possesses a thickness of only about 0.0005 to about 0.0015 inch for the example described above.

The invention is not limited to circuitized substrates having only a singular layer of dielectric, but also extends to substrates of the multilayered variety, including particularly those having at least three or more internal conductive (e.g., copper) planes which may function as power, signal or ground planes in the final structure. Such planes are not shown in FIG. 1, but, if utilized, would be substantially parallel to conductive layers 21 and spaced within the dielectric layer 10 at predefined distances. One or more of these layers could be electrically joined to the internal conductive layer 21 within hole 13 and/or hole 15. Thus, it is understood that a circuit path may be formed from the conductive layer on upper surface 17 to one or more internal conductive planes using holes 13 and 15. Additionally, it is also understood that a circuit path may be formed through the entire dielectric layer thickness to the opposing, bottom surface.

Should one or more internal conductive layers be desired, the resulting structure can be formed utilizing known lamination procedures typically utilized to produce multilayered circuit boards such as disclosed herein. Typically, individual layers of dielectric (prepreg) and conductive layers (e.g., copper foil) are stacked in a predefined orientation and then laminated to form a singular, laminated structure. Further description is thus not believed necessary.

Conductive layers 21 may be formed on the invention's dielectric using one or more known processes. In a preferred embodiment, these thin layers were formed using an electroless plating operation. Furthermore, the holes 13 and 15 were provided prior to deposition of this conductive coating, these holes being formed in the dielectric by drilling, punching, laser ablation or etching.

Although both holes 13 and 15 are shown as including a conductive layer thereon, it is within the scope of the invention to not provide such a conductive coating on selected ones of the holes while still attaining the advantageous features of the instant invention. Specifically, it is possible in the present invention to simply provide the hole and then plate other, desired surfaces, thus leaving the hole substantially non-conductive. Such a hole may be formed within a circuitized substrate such as taught herein for the purpose of enhanced thermal transfer or to receive a separate conductive element (e.g., module pin). In most cases, however, the holes will include an electrically conductive layer as shown in FIG. 1.

In FIG. 1, layer 10 and conductive layer 21 (which will form at least part of the final circuitry for the substrate produced herein) are shown to include a layer (quantity) of fill material 23 on opposite sides thereof In a preferred embodiment of the invention, the layer of fill material is a dry film material known as Vacrel (Vacrel is a trademark of E. I. du Pont de Nemours and Co. (du Pont). Significantly, this material is preferably photoimageable, meaning that curing thereof may subsequently occur using photoimaging or similar exposure processing. Importantly, the fill 23 as initially positioned in the embodiment of FIG. 1 is uncured (not cured). By the term "uncured" is meant a material that has not been UV-exposed or baked. In the specific example, the Vacrel had a viscosity of about 20 mPoise at room temperature. This material is well-known and further description is not believed necessary. It is also possible in accordance with the teachings of this invention to utilize other materials for the fill, including, any acrylate-based or epoxy-based photoimageable dielectric material. In a preferred embodiment, the fill 23 is first positioned on a dielectric support layer 25 which, in a preferred embodiment of the invention, is Mylar (Mylar is a trademark of du Pont), and this composite then placed on the substrate's outer surfaces.

In the above example, support layer 25 may possess a thickness of only about 0.001 inch and the fill material 23 thereon a thickness of only about 0.0005 to about 0.004 inch. (Fill 23 may have an overall thickness of up to about 0.040 inch.) This composite structure is then positioned on layer 10 with the fill facing the layer's outer surfaces. The support layer 25 thus also serves as 23 a protective layer for the product at this stage of its production.

Figure 2:
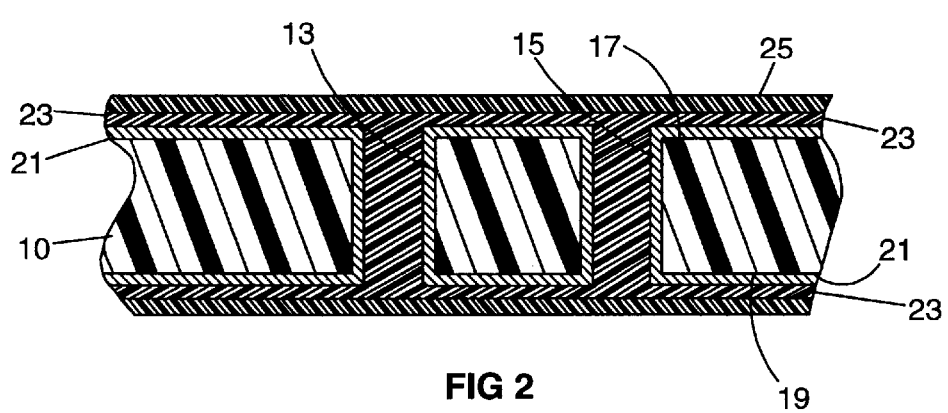

With support layer 25 and fill material 23 in place, the fill material is now introduced into holes 13 and 15. In a preferred embodiment, this filling occurs using a vacuum lamination process at a temperature within the range of about 140° Fahrenheit (F) to about 200° F. In one example, a temperature of 160° F. proved satisfactory. As seen in FIG. 2, the fill 23 substantially fills the entire area of each hole. Vacuum lamination of substrates such as printed circuit boards is a well-known process and further description is not believed necessary. In the case of the present invention, however, it is significant to note that such vacuum lamination occurs with the fill and support covering the holes. Such a process results in lateral vacuum draw at the various layer interfaces, thus "pulling" the fill into the holes as shown. It is also important to note that none of the Mylar support layer 25 extends within the holes as a result of this vacuum lamination. Such filling as defined herein occurs substantially instantaneously and thus represents an extremely minor portion of the time required to produce a relatively complicated structure as taught herein. Alternatively, it is possible to introduce uncured fill material into holes 13 and 15 using a hollow pin fixture in which liquid, uncured, fill is forced into the holes (e.g., using an actuating piston in the hollow fixture. Vacuum lamination is preferred, however.

Figure 3:
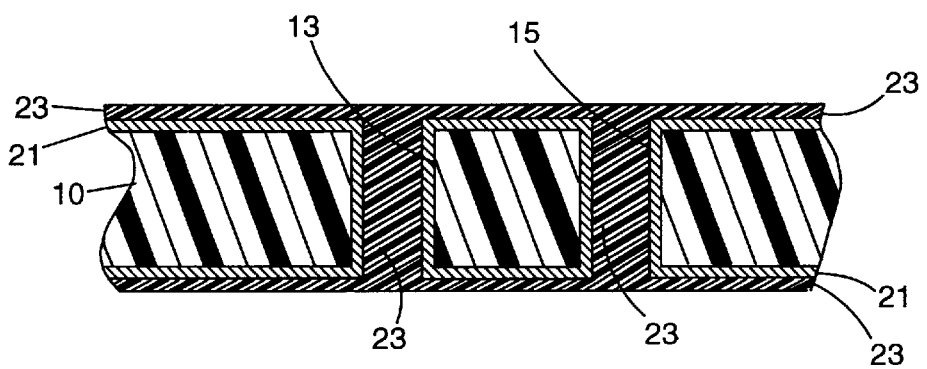

In FIG. 3, the support layer 25 (not shown) has been removed, preferably by peeling it away, e.g., using relatively uncomplicated stripping apparatus. Other means of removing this thin film are possible, including manual peeling.

With support layer 25 removed, the fill material 23 within holes 13 and 15 is now partially cured. Being a photoimageable material, the fill is selectively exposed to ultraviolet (UV) radiation using standard UV exposure equipment, such exposure for a product of the size described hereinabove preferably occurring for a time period of only about 30 seconds to about five minutes using UV radiation at a wavelength of about 365 mm. The result of such exposure is a partially cured dielectric fill material only within holes 13 and 15. To assure this selective curing, a mask (not shown) is aligned relative to the substrate in FIG. 3, the mask including openings therein of a pattern similar to that of the substrate's holes in which partial curing is desired. Therefore, by the term partially cured is meant that the fill material is either cross-linked (e.g., by UV radiation) or baked at a temperature below the transition temperature (Tg) of fully cured material.

Figure 4:
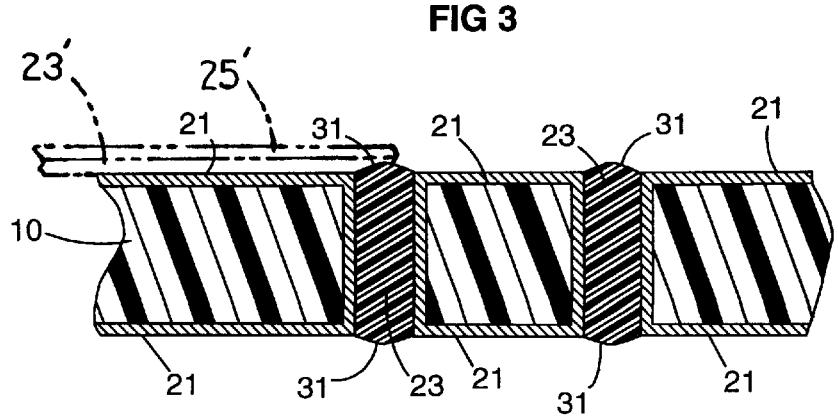

Following partial cure, it is desired to remove a substantial portion or all of the uncured fill material remaining on the upper and lower outer surfaces of underling conductive layer 21. Specifically, the next step of the operation involves the removal of portions of fill material which have not been partially cured as a result of the aforedescribed UV radiation exposure. A preferred method of doing so, resulting in a structure as substantially as seen in FIG. 4, is to use photoimaging processing, preferably using a known photo-lithographic solvent, e.g., sodium carbonate. Other solvents (developers) are possible, depending on the selected fill material. Following this procedure, relatively small protrusions 31 ("nubs") are seen to exist (FIG. 4). Removal of these projections is preferably accomplished using a mechanical removal process, including, e.g., grinding or polishing. The resulting structure, as seen in FIG. 5, is a substrate wherein the outer surfaces of the partially cured fill 23 and the outer surface of the conductive layer 21 are coplanar, and thus flat across the entire outer surfaces.

Figure 5:
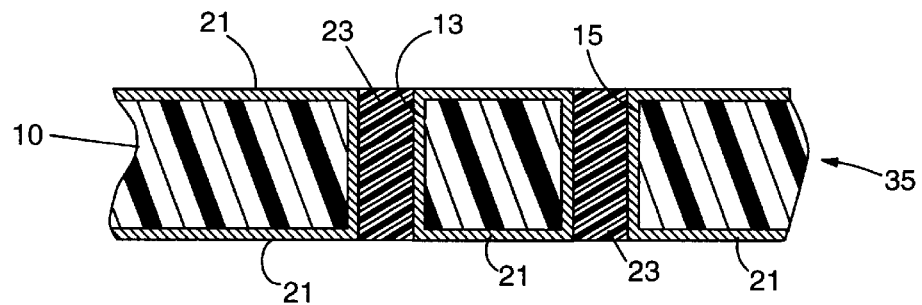

With the substrate as now shown in FIG. 5, the next step in the present invention is to substantially fully cure the partially cured fill 23. This is also accomplished using a photoimaging process, similar to that described above to accomplish partial cure, followed by a baking step. As a result of this final cure process, the solvent is removed and the remaining fill material 23 is now thermally stable and solidified in position. The baking step immediately follows the photoimaging process with the fill subjected to a temperature of about 250° F. to about 400° F. for a time period of about 1 to 4 hours. During photoimaging, which occurs for a time period of about 30 seconds to 5 minutes, the material is subjected to UV radiation at a wavelength of about 300 to about 400 nm. The photoimaging step assures fill cross-linking while the bake step serves to thermally stabilize the fill (which now is a solidified member firmly seated within its respective hole).

The substrate as shown in FIG. 5 is understood to include outer conductive layers 21 as well as internal plated through holes containing fill 23 therein. It is again noted that although no internal conductive planes are shown in FIG. 5, one or more may be easily provided and electrically coupled to corresponding ones of such plated through boles. It is understood that such outer conductive layers, as well as internal conductive layers, may be in the form of patterned electrical circuitry or, as a substantially solid plane (e.g., if the conductive layer is to serve as a ground). The invention is not limited to any specific patterns.

In a somewhat different aspect of the invention, it is possible to provide a structure as shown in FIG. 5 using a method wherein only one curing step is required. This method involves providing a structure as shown in FIG. 3 and thereafter removing ail uncured fill material on the substrate's outer surfaces (other than that on the holes' internal walls). A second support layer (25', shown in phantom in FIG. 4) (this of photoresist) and quantity of uncured fill (23', shown in phantom in FIG. 4) are positioned on each side, and the fill thereof forced into holes 13 and 15 to thus occupy any non-filled areas. The photoresist is then rapidly developed (e.g., using sodium carbonate, a known developer) and removed. Both uncured fills in holes 13 and 15 are then subject to UV radiation and substantially cured, using a single exposure. This exposure preferably occurs for a time period of about 30 seconds to about five minutes. In a preferred embodiment, UV radiation at a wavelength of about 365 nanometers was provided. The above method assures complete hole fill and curing, while reducing the curing to only one step. Further processing as occurred above for substrate 35 is now possible, including performing the same operations (e.g., component attach) shown in FIGS. 6–8. Further description is thus not necessary. It is also possible when performing the above steps to provide the support layer 25' in a form that enables UV radiation and/or light exposure of a photoresist to occur therethrough, the support layer remaining during such processing.

Figure 6:
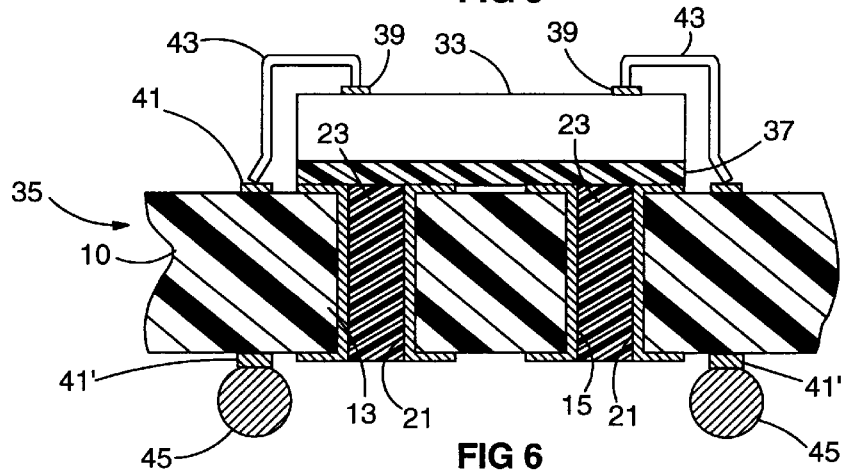
FIGS. 6–8 illustrate various electronic structures that can be produced using circuitized substrates formed in accordance with this invention's teachings.

In FIG. 6, the next step of the invention involves the placement of at least one electrical component 33 on the upper surface of the formed circuitized substrate (now identified with the numeral 35). In one example, component 33 may comprise a semiconductor chip which is secured to the substrate 35 using a dielectric adhesive 37. In the embodiment shown in FIG. 6, chip 33 has its conductive elements 39 located across its upper surface, these contact elements (or sites) electrically coupled to corresponding circuit elements (e.g., lines or pads) 41 which form part of the previously defined conductive circuit layer 21. Formation of such pads and lines is preferably accomplished using photolithography processing, which is well-known in the art of manufacturing of printed circuit boards. Thus, in the embodiment of FIG. 6, a plurality of conductive wires 43 may be used to electrically couple the chip's elements 39 and corresponding circuit elements 41. Should adhesive 37 be a sound thermal conductor, it is also seen in FIG. 6 that heat generated by the chip 33 may pass through the conductive layers 21 of the invention's holes 13 and 15 to exit on the opposite side of the dielectric layer 10 from that which fix chip is positioned. Significantly, the fully cured filled material 23 prevents any passage of adhesive 37 through the formed substrate and also prevents the intrusion of ionics, fluids, etc. during subsequent processing (e.g., precious metal plating). Thus, the plated holes 13 and 15 may serve as heat sinks to enhance chip operation while also enhancing subsequent encapsulating of the positioned component.

As further seen in FIG. 6, it is possible to electrically couple a plurality of solder balls 45 to corresponding circuit elements 41' on the substrate's lower surface. In the event that conductive elements 41 on the substrate's upper surface are electrically coupled to corresponding elements 41' (e.g., through plated through holes not shown), it is thus seen that chip 33 is electrically coupled to the corresponding solder balls 43 which in turn may be directly electrically coupled to corresponding pads or other circuit elements (not shown) on yet another circuitized substrate (e.g., printed circuit board). In such a configuration, the substrate of FIG. 6 can also be referred to as a plastic ball grid array (PBGA) having several such solder balls on its lower surface for coupling to circuit boards and thus providing an enhanced means of electrically connecting semiconductor chips to this board.

Figure 7:
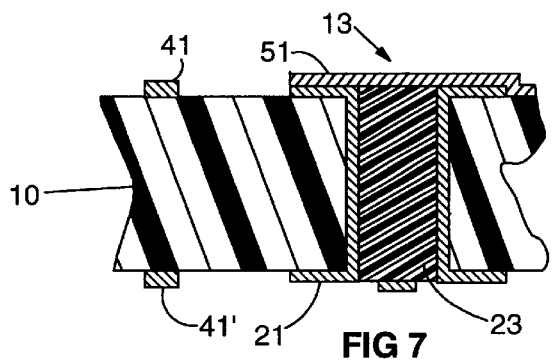

In FIG. 7, another conductive layer 51 has been provided atop the conductive opening 13 to extend outwardly (to the right in FIG. 7) from this opening for electrical coupling to additional electrical components which also form part of the finished circuitized substrate product. It is thus seen that this circuit element 51 is electrically coupled to the conductive hole 13 such that any component coupled to element 51 may in turn be electrically coupled to another element or circuit line, pad, etc. located on an opposite of the dielectric layer 10.

Figure 8:
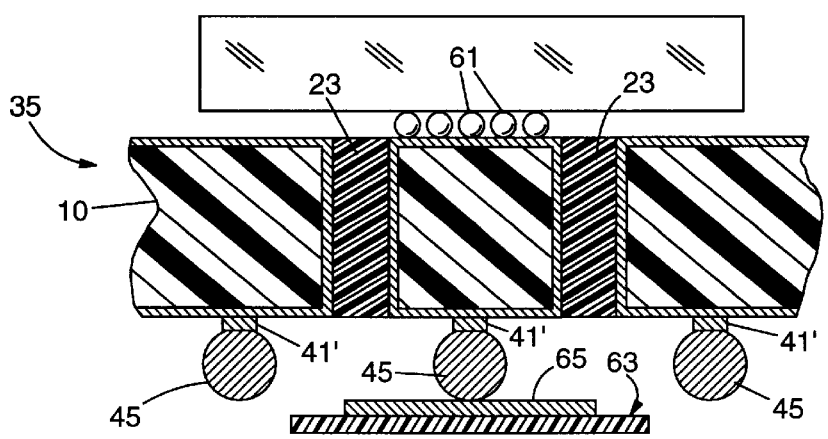

In FIG. 8, an alternative example of a circuitized substrate product which can be produced in accordance with the teachings herein is shown. This circuitized substrate 35 includes a dielectric layer 10 as before, but in this embodiment provides direct coupling of the chip 33 to the underlying circuitry 21 using a plurality of solder balls 61. Although circuit layer 21 is shown as being substantially solid in FIG. 8, it is understood that the individual solder balls 61 are directly coupled to corresponding, individual lines and/or pads. Such a substrate 35 may also include solder balls 45 on the undersurface thereof which, as described above, may be electrically coupled to one or more of the contact sites of chip 33 through circuitry 21. In FIG. 8, the receiving circuit board 63 is only partially shown and includes a receiving pad 65 on which the solder ball 45 are coupled. The embodiment depicted in FIG. 8 can also be referred to as a direct chip attach structure, meaning that the chip's contact elements (not shown) on its undersurface are directly coupled (in this case, using solder balls 61) to corresponding circuitry 21 of the circuitized substrate.

In addition to the several embodiments depicted herein, it is understood that several alternative embodiments are readily possible using the unique teachings of this invention. For example, it is possible to electrically couple the semiconductor chip to the substrate's upper surface using an alternative method, e.g., thermocompression bonding. Still further, it is possible to provide alternative connections between the substrate's lower conductive elements 41' and corresponding pads 65 or the like. One example could be to utilize a spring contact or the like which exerts pressure against the lower elements 41', e.g., when substrate 31 is positioned within a suitable electrical connector containing such contacts. It is also within the scope of the invention to provide an encapsulant or adhesive in the embodiment of FIG. 8 to substantially surround the plurality of solder balls 61. Should this be desirable, the fully cured fill material 23, as stated, prevents encapsulant or adhesive passage through the substrate 35.

Thus there has been shown and described a method of making a circuitized substrate wherein fill material may be provided within the substrate's holes to attain the unique advantages taught herein. Specifically, the substrate as produced in accordance with the teachings herein is able to provide conductive circuit or pad members across the top of such filled holes to thus increase the circuit density. It is also possible to directly position electrical components (e.g., semiconductor chips or modules) directly atop these filled holes.

While there have been shown and described what are at present considered the preferred embodiments of the invention, it will be obvious to those skilled in the art that various modifications may be made therein without departing from the scope of the invention as defined by the appended claims.

What is claimed is:

1. A method of making a circuitized substrate, said method comprising:
   providing a layer of dielectric material having a first surface;
   forming at least one hole within said layer of dielectric material;
   positioning a quantity of uncured, dielectric fill material within said at least one hole and onto at least part of said first surface;
   partially curing said quantity of uncured, dielectric fill material within said at least one hole;
   removing said dielectric fill material on said at least part of said first surface; and
   thereafter further curing said partially cured dielectric fill material within said at least one hole.

2. The method of claim 1 wherein said layer of dielectric material is formed as a laminate.

3. The method of claim 1 wherein said at least one hole is formed in said layer of dielectric material using a process selected form the group of processes consisting of drilling, punching, laser ablation and etching.

4. The method of claim 1 wherein said at least one hole within said layer of dielectric material is defined by internal walls within said dielectric material, said method further including the step of forming an electrically conductive layer on said internal walls of said at least one hole within said layer of dielectric material prior to said positioning of said quantity of uncured, dielectric fill material within said at least one hole.

5. The method of claim 4 further including forming said conductive layer onto said at least part of said first surface.

6. The method of claim 5 wherein said electrically conductive layer is formed using an electroless plating operation.

7. The method of claim 1 wherein said quantity of uncured, dielectric fill material is positioned within said at least one hole using a vacuum lamination process.

8. The method of claim 7 wherein said vacuum lamination process is performed at a temperature within the range of about 140° F. to about 200° F.

9. The method of claim 1 wherein said partially curing of said dielectric fill material is accomplished using a photoimaging process.

10. The method of claim 9 wherein said photoimaging process comprises exposing said dielectric fill material to UV radiation.

11. The method of claim 10 wherein said exposing of said dielectric fill material is accomplished for a time period of about 30 seconds to about 5 minutes.

12. The method of claim 9 wherein said removing of said dielectric fill material from said at least one part of said first surface is accomplished using photoimaging processing.

13. The method of claim 1 wherein a portion of said uncured fill material extends substantially above said first surface following said removing of said fill material on said at least part of said first surface.

14. The method of claim 13 wherein said portion extending substantially above said first surface is removed using a mechanical removal process.

15. The method of claim 1 wherein said further curing of said partially cured dielectric fill material is accomplished using a photoimaging process.

16. The method of claim 15 wherein said photoimaging process comprises exposing said partially cured dielectric fill material to UV radiation.

17. The method of claim 16 wherein said exposing of said partially cured dielectric fill material is accomplished for a time period of about 30 seconds to about 5 minutes and is followed by a baking step wherein the fill material is heated to a temperature of from about 250° F. to about 400° F.

18. The method of claim 1 further including applying an electrically conductive layer on said dielectric fill material after said further curing thereof.

19. The method of claim 18 further including electrically coupling at least one electrical component to said electrically conductive layer on said dielectric fill material.

20. The method of claim 1 further including positioning at least one electrical component on said first surface and substantially over said at least one hole, and thereafter providing a quantity of encapsulant material substantially under said electrical component, said fill material within said at least one hole preventing passage of said encapsulant material through said at least one hole.

21. A method of making a circuitized substrate, said method comprising:
   providing a layer of dielectric material having a first surface;
   forming at least one hole within said layer of dielectric material;
   positioning a first quantity of uncured, dielectric fill material within said at least one hole and onto at least part of said first surface;
   removing said uncured, dielectric fill material on said at least part of said first surface;
   positioning a second quantity of uncured, dielectric fill material onto said first surface and substantially over said at least one hole having said first quantity of uncured, dielectric fill material therein; and
   thereafter substantially curing said first quantity of uncured dielectric fill material within said at least one hole and said second quantity of dielectric fill material within and substantially over said at least one hole.

22. The method of claim 21 wherein said layer of dielectric material is formed as a laminate.

23. The method of claim 21 wherein said at least one hole is formed in said layer of dielectric material using a process selected from the group of processes consisting of drilling, punching, laser ablation and etching.

24. The method of claim 21 wherein said at least one hole within said layer of dielectric material is defined by internal walls within said dielectric material, said method further including the step of forming an electrically conductive layer on said internal walls of said at least one hole within said layer of dielectric material prior to said positioning of said first quantity of uncured, dielectric fill material within said at least one hole.

25. The method of claim 24 further including forming said conductive layer onto said at least part of said first surface.

26. The method of claim 25 wherein said electrically conductive layer is formed using an electroless plating operation.

27. The method of claim 21 wherein said first and second quantities of uncured, dielectric fill material are positioned within and substantially over said at least one hole using a vacuum lamination process.

28. The method of claim 27 wherein said vacuum lamination process is performed at a temperature within the range of about 140° F. to about 200° F.

29. The method of claim 21 wherein said substantially curing of said dielectric fill material is accomplished using a photoimaging process.

30. The method of claim 29 wherein said photoimaging process comprises exposing said dielectric fill material to UV radiation.

31. The method of claim 30 wherein said exposing of said dielectric fill material is accomplished for a time period of about 30 seconds to about five minutes.

32. The method of claim 21 further including applying an electrically conductive layer on said second quantity of said dielectric fill material after said curing thereof.

33. The method of claim 32 further including electrically coupling at least one electrical component to said electrically conductive layer on said dielectric fill material.

34. The method of claim 21 further including positioning at least one electrical component on said first surface and substantially over said at least one hole, and thereafter providing a quantity of encapsulant material substantially under said electrical component, said fill material within said at least one hole preventing passage of said encapsulant material through said at least one hole.

* * * * *